US012563848B2

(12) United States Patent
Hsu

(10) Patent No.: US 12,563,848 B2
(45) Date of Patent: Feb. 24, 2026

(54) IMAGE SENSOR PACKAGE

(71) Applicant: Powertech Technology Inc., Hukou Township, Hsinchu County (TW)

(72) Inventor: Hung-Hsin Hsu, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 384 days.

(21) Appl. No.: 18/462,398

(22) Filed: Sep. 6, 2023

(65) Prior Publication Data

US 2025/0040276 A1 Jan. 30, 2025

(30) Foreign Application Priority Data

Jul. 27, 2023 (CN) .......................... 202310931643.7

(51) Int. Cl.
*H10F 39/12* (2025.01)
*H10F 39/00* (2025.01)

(52) U.S. Cl.
CPC ......... *H10F 39/804* (2025.01); *H10F 39/811* (2025.01)

(58) Field of Classification Search
CPC ........ H10F 39/12; H10F 39/80; H10F 39/804; H10F 39/811
See application file for complete search history.

(56) References Cited

U.S. PATENT DOCUMENTS

| | | | | |
|---|---|---|---|---|
| 11,393,859 B2 * | 7/2022 | Jo | ........................... | H01L 24/49 |
| 2006/0180887 A1 * | 8/2006 | Ono | ......................... | H10F 77/50 |
| | | | | 257/E31.118 |
| 2008/0309805 A1 * | 12/2008 | Chan | ...................... | H10F 39/804 |
| | | | | 348/294 |
| 2010/0279452 A1 * | 11/2010 | Lu | .......................... | H10F 39/804 |
| | | | | 257/E31.11 |
| 2015/0179614 A1 * | 6/2015 | Murai | ...................... | H01L 25/50 |
| | | | | 257/784 |
| 2017/0179176 A1 * | 6/2017 | Borthakur | ............. | H10F 39/804 |
| 2018/0226442 A1 * | 8/2018 | Huang | .................. | H10F 39/011 |
| 2021/0026164 A1 * | 1/2021 | Skorka | .................... | G01J 4/04 |
| 2021/0028217 A1 * | 1/2021 | Cho | ..................... | H10F 39/8063 |
| 2023/0420469 A1 * | 12/2023 | Kim | ...................... | H10F 39/028 |

* cited by examiner

*Primary Examiner* — Tuyen K Vo
(74) *Attorney, Agent, or Firm* — patenttm.us

(57) ABSTRACT

An image sensor package includes an image sensor chip having a chip body, a metal dam, and a transparent substrate having a surface. The chip body has an active surface including a photosensitive area and a non-sensitive area surrounding the photosensitive area. The metal dam is formed on the non-sensitive area of the active surface, surrounds a photosensitive layer formed on the photosensitive area at intervals, is electrically insulated from the chip body, and has a thickness. A glue dam is formed on the surface and is aligned with and is bonded to the metal dam. A thickness of the glue dam is less than the thickness of the metal dam. Accordingly, the metal dam and the glue dam are combined to form a dam structure, and the quantity of liquid glue to form the glue dam is decreased. Thus, the yield of the image sensor package is enhanced.

19 Claims, 4 Drawing Sheets

IMAGE SENSOR PACKAGE

CROSS-REFERENCE TO RELATED APPLICATIONS

This application is based upon and claims priority under 35 U.S.C. 119 from China Patent Application No. 202310931643.7 filed on Jul. 27, 2023, which is hereby specifically incorporated herein by this reference thereto.

BACKGROUND OF THE INVENTION

1. Field of the Invention

The present invention is related to a semiconductor package, in particular to an image sensor package.

2. Description of the Prior Arts

With reference to FIG. 5, in a manufacturing process of a conventional image sensor package, a liquid glue is first formed on a surface 41 of a transparent substrate 40 to form a glue dam 50. The surface 41 of the transparent substrate 40 has an inner area exposed from the glue dam 50. Then, an image sensor chip 60 is provided and includes an active surface 61 and a photosensitive layer 62. The active surface 61 faces toward the surface 41 of the transparent substrate 40. The photosensitive layer 62 is formed on the active surface 61 and corresponds to the inner area of the transparent substrate 40. Next, with further reference to FIG. 6, the image sensor chip 60 is bonded to the transparent substrate 40 through the glue dam 50.

When the image sensor chip 60 is bonded to the transparent substrate 40, the glue dam 50 is still in a liquid state and is squeezed. Thus, the glue dam 50 flows inward and toward the photosensitive layer 62 of the image sensor chip 60 along the surface 41 of the transparent substrate 40 and the active surface 61 of the image sensor chip 60. If a residual glue 51 of the glue dam 50 flows toward the photosensitive layer 62, the photosensitive layer 62 is contaminated with the residual glue 51. Thus, the yield of the conventional image sensor package is reduced because of the residual glue 51. The conventional image sensor package needs to be improved.

SUMMARY OF THE INVENTION

An objective of the present invention is to provide an image sensor package.

To achieve the objection as mentioned above, the image sensor package includes:

an image sensor chip having a chip body including an active surface, a rear surface opposite to the active surface, and a photosensitive layer formed on the active surface, wherein the active surface includes:

a photosensitive area, wherein the photosensitive layer is located in the photosensitive area; and a non-sensitive area surrounding the photosensitive area;

a metal dam formed on the active surface of the chip body, located on the non-sensitive area of the active surface, surrounding the photosensitive area, electrically insulated from the chip body, and has a first thickness, wherein a gap is defined between an inside surface of the metal dam and an outside surface of the photosensitive area; and a transparent substrate having:

a surface facing toward the active surface of the chip body; and a glue dam formed on the surface and having a second thickness, wherein the glue dam is aligned with the metal dam and the transparent substrate is bonded to the image sensor chip through the glue dam and the metal dam, wherein the second thickness is less than the first thickness.

With the foregoing description, the metal dam of the image sensor package in accordance with the present invention is formed on the active surface of the chip body of the image sensor chip and is located on the non-sensitive area of the active surface. The metal dam is electrically insulated from the chip body of the image sensor chip. The glue dam is formed on the surface of the transparent substrate. The glue dam is aligned with the metal dam so that the transparent substrate is bonded to the image sensor chip through the glue dam and the metal dam. The second thickness of the glue dam is less than the first thickness of the metal dam. Accordingly, the metal dam and the glue dam are combined to form a dam structure. Compared to the dam structure and the conventional glue dam completely formed from the liquid glue, the quantity of the liquid glue to form the glue dam of the dam structure is greatly decreased. Furthermore, the dam structure facilitates the advancement of preventing the liquid glue from flowing toward the photosensitive layer in the manufacturing process of the image sensor package. Therefore, the yield of the image sensor package is effectively enhanced.

DETAILED DESCRIPTION OF THE EMBODIMENTS

The technical content of the present invention is described in detail with multiple embodiments in conjunction with the drawings.

Figure 1:
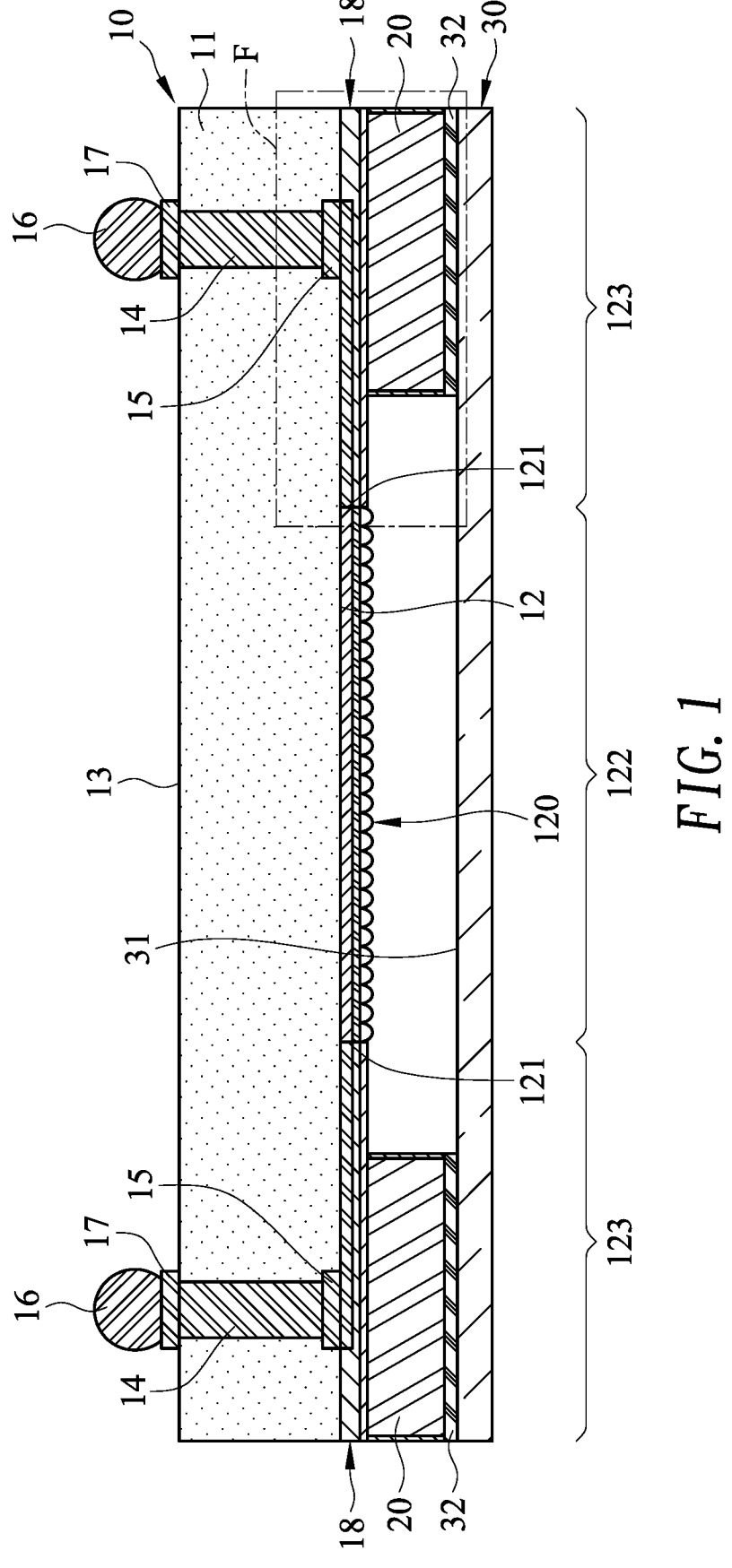
FIG. 1 is a side view in a partial section of a first embodiment of an image sensor package in accordance with the present invention.

With reference to FIG. 1, a first embodiment of the image sensor package in accordance with the present invention is shown. The image sensor package includes an image sensor chip 10, a metal dam 20, and a transparent substrate 30.

The image sensor chip 10 has a chip body 11 including an active surface 12, a rear surface 13, and a photosensitive layer 120. The active surface 12 and the rear surface 13 are opposite to each other. The active surface 12 includes a photosensitive area 122 and a non-sensitive area 123. The non-sensitive area 123 surrounds the photosensitive area 122. The photosensitive layer 120 is formed on the active surface 12 and is located in the photosensitive area 122.

Figure 2:
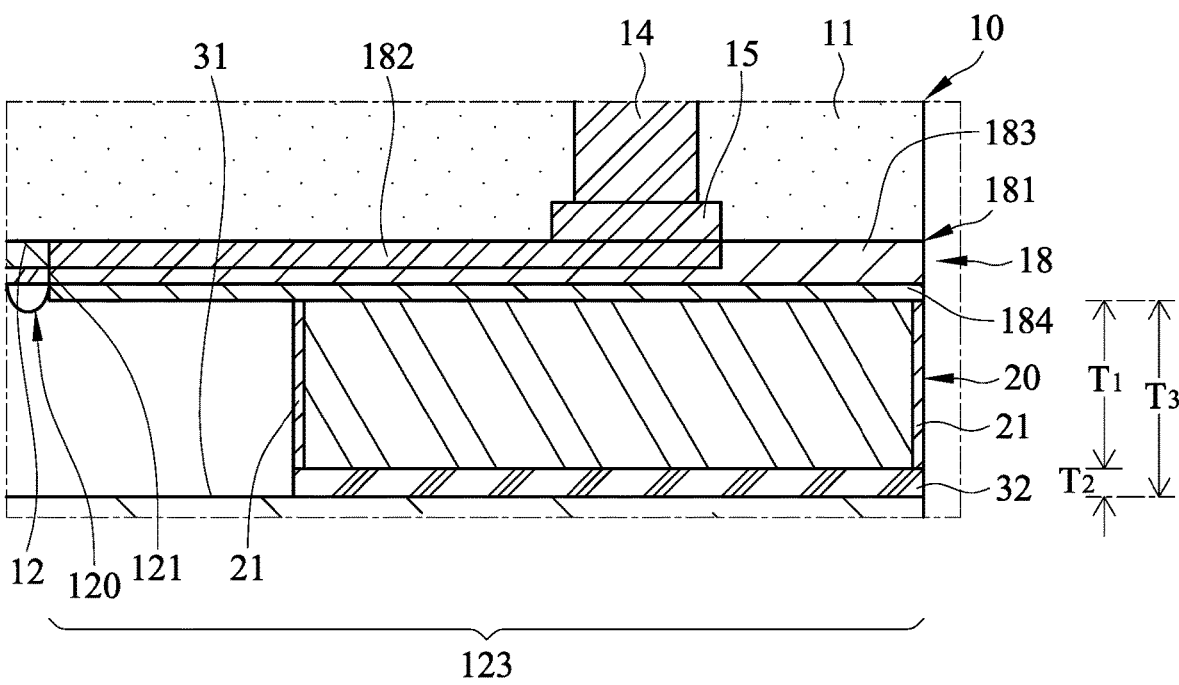
FIG. 2 is an enlarged view of an F area in FIG. 1.

With reference to FIGS. 1 and 2, in one embodiment, the image sensor chip 10 may further include a plurality of conductive vias 14, a plurality of inner metal pads 15, a plurality of outer metal pads 17, a plurality of outer connectors 16, and a wiring layer 18. The conductive vias 14 are formed through the chip body 11 and are located in the non-sensitive area 123 of the active surface 12. The inner metal pads 15 are formed on the active surface 12 of the chip body 11 and correspond to and are respectively connected to the conductive vias 14. The outer metal pads 17 are formed on the rear surface 13 of the chip body 11 and correspond to and are respectively connected to the conductive vias 14. The outer connectors 16 are respectively formed on the outer metal pads 17. In one embodiment, each outer connector 16 may be a solder ball or a metal bump but is not limited thereto. The wiring layer 18 is formed on the active surface 12 of the chip body 11 and is located in the non-sensitive area 123 of the active surface 12. The wiring layer 18 is electrically connected to the photosensitive layer 120 and the inner metal pads 15. As shown in FIG. 2, the wiring layer 18 includes a plurality of metal wires 182 and an insulation layer 181. The metal wires 182 are formed on the active surface 12 and are connected to the photosensitive layer 120 and the inner metal pads 15. The insulation layer 181 covers the metal wires 182. In one embodiment, the insulation layer 181 may include a passivation layer 183 and a dielectric layer 184. In this way, the passivation layer 183 first covers the metal wires 182, then the dielectric layer 184 is formed on the passivation layer 183.

Figure 3:
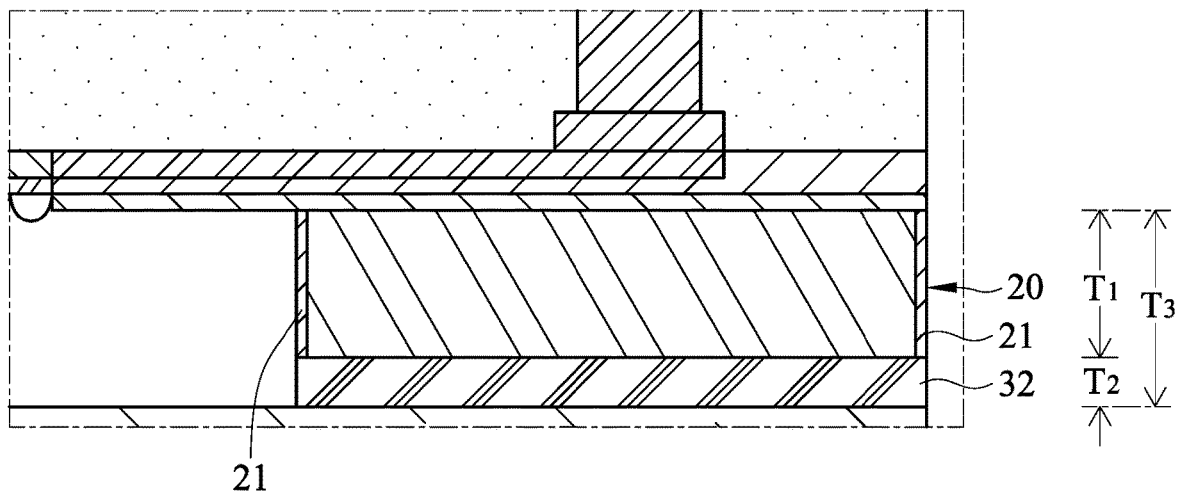
FIG. 3 is an enlarged side view in a partial section of a second embodiment of an image sensor package in accordance with the present invention.

With reference to FIGS. 1 and 2, the metal dam 20 is formed on the active surface 12 of the chip body 11 of the image sensor chip 10 and is located on the non-sensitive area 123 of the active surface 12. The metal dam 20 surrounds the photosensitive layer 120. In this way, A gap is defined between an inside surface of the metal dam 20 and an outside surface 121 of the photosensitive layer 120. The metal dam 20 is electrically insulated from the chip body 11 of the image sensor chip 10. As shown in FIG. 2, the metal dam 20 has a first thickness T1. Specifically, the metal dam 20 may be formed on the dielectric layer 184 of the insulation layer 181 of the wiring layer 18. Thus, the metal dam 20 is electrically insulated from the metal wires 182, the inner metal pads 15, and the conductive vias 14 which are located in the non-sensitive area 123. Additionally, the metal dam 20 may be made by an electroless-plated metal. In the present embodiment, the first thickness T1 may be about 30 μm but is not limited thereto. With further reference to FIGS. 2 and 3, in one embodiment, the metal dam 20 may have a light-absorbing layer 21. The light-absorbing layer 21 is formed on an exposed surface of the metal dam 20. Especially the absorbing layer 21 is formed on the inside surface of the metal dam 20 facing toward the photosensitive layer 120. In one embodiment, the light-absorbing layer 21 may be an oxidized metal layer or may be black. Thus, the light-absorbing layer 21 prevents the metal dam 20 from reflecting the light and generating the light-sensing noise. Additionally, a melting point of the metal dam 20 may be greater than or may be equal to 300° C. to prevent the metal dam 20 from melting in the reflow soldering process of the image sensor package. Based on the melting point described above, the metal dam 20 may be made by copper (Cu) but is not limited thereto.

The transparent substrate 30 is mounted on the image sensor chip 10. A distance is defined between the transparent substrate 30 and the image sensor chip 10. The transparent substrate 30 includes a surface 31 and a glue dam 32. The surface 31 faces toward the active surface 12 of the chip body 11 of the image sensor chip 10. The glue dam 32 is formed on the surface 31. The glue dam 32 is aligned with the metal dam 20 so that the transparent substrate 30 is bonded to the image sensor chip 10 through the glue dam 32 and the metal dam 20. With reference to FIGS. 2 and 3, the glue dam 32 has a second thickness T2. A percentage value of the second thickness T2 to a total thickness T3 of the first and second thickness T1 and T2 may be between about 14.3% and 25%. In other words, the second thickness T2 may be between about 5 μm and 10 μm but is not limited thereto. In the present embodiment, as shown in FIG. 2, the second thickness may be about 5 μm. In one embodiment, as shown in FIG. 3, the second thickness T2 may be about 10 μm. In one embodiment, as shown in FIG. 1, a lateral size of the transparent substrate 30 and a lateral size of the chip body 11 may be the same. Thus, an outer side of the transparent substrate 30, an outer side of the glue dam 32, and an outer side of the metal dam 20 are flush with an outer side of the chip body 11.

Figure 4:
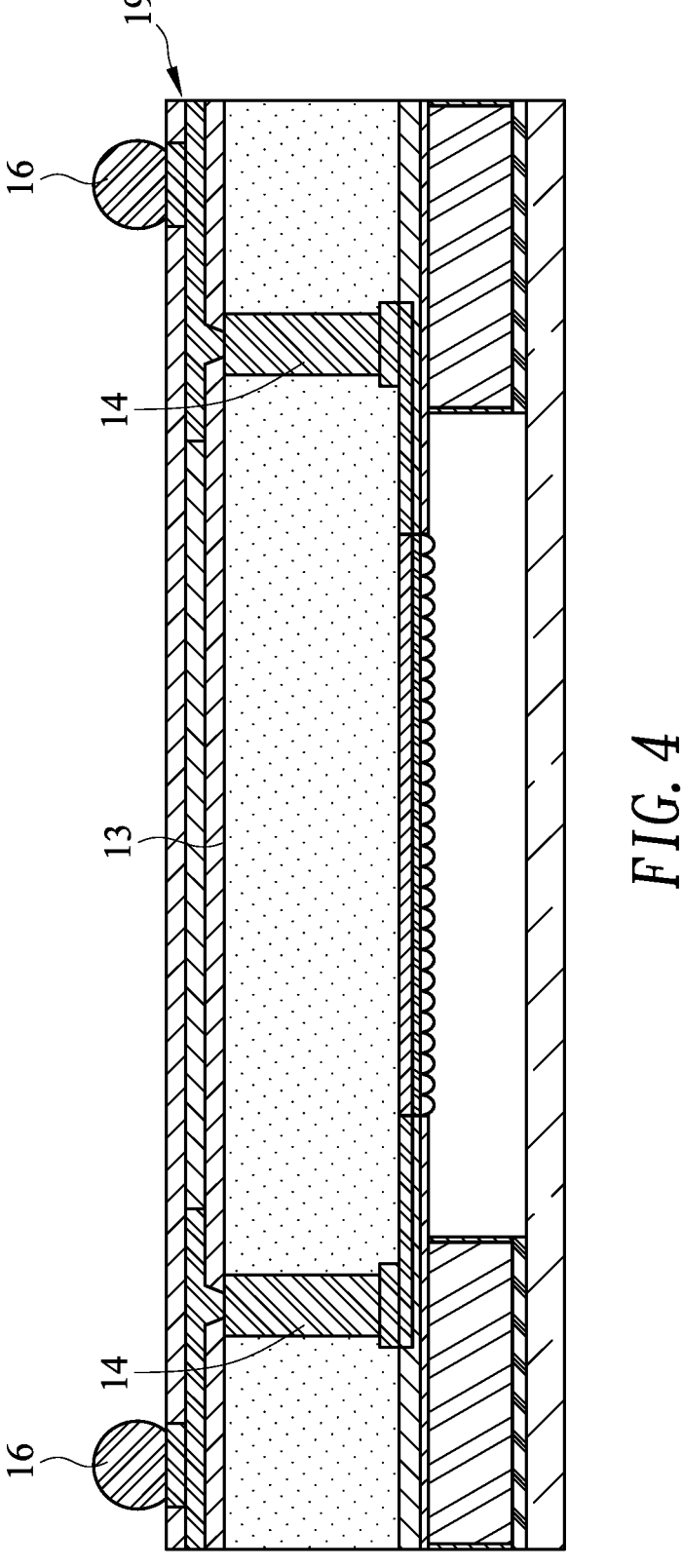
FIG. 4 is a side view in a partial section of a third embodiment of an image sensor package in accordance with the present invention.
Figure 5:
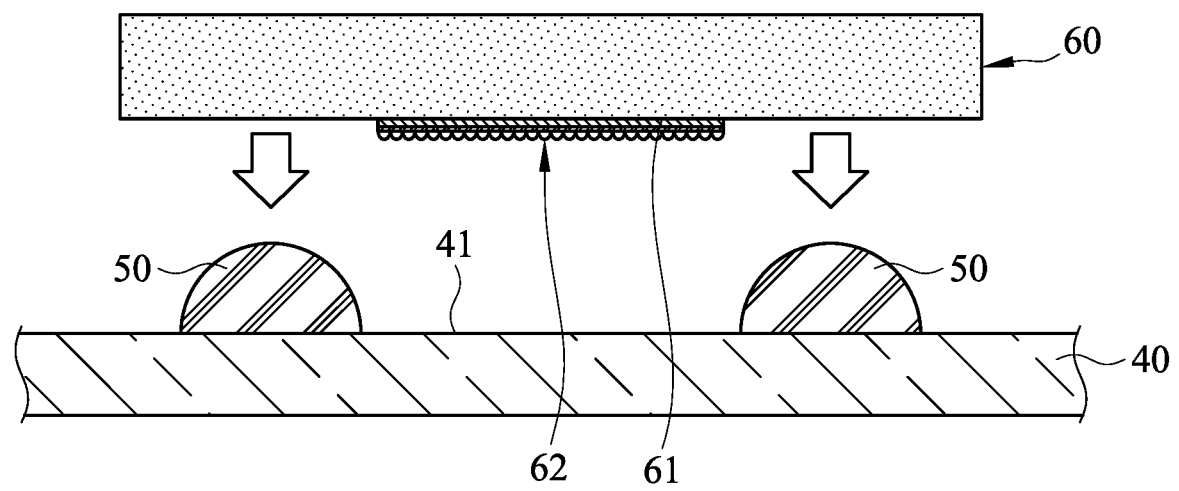
FIG. 5 is a side view in a partial section of a conventional image sensor package illustrating an image sensor chip before being bonded to a transparent substrate.
Figure 6:
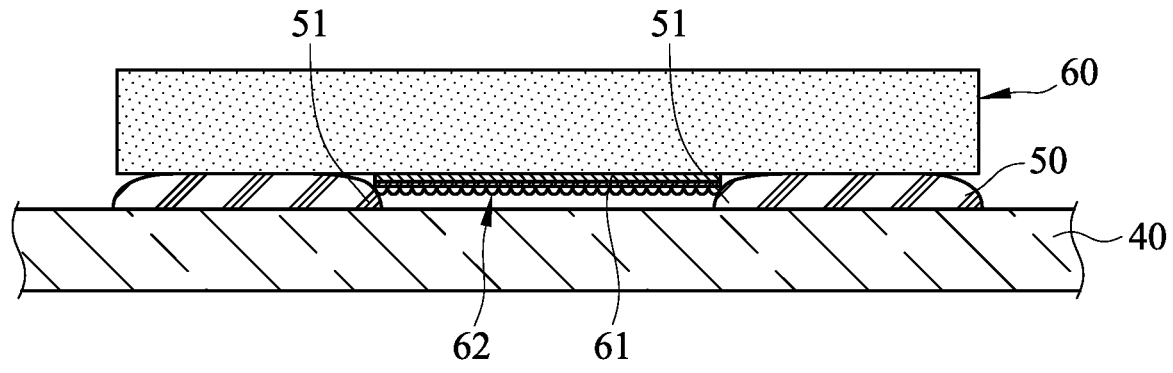
FIG. 6 is a side view in a partial section of the conventional image sensor package illustrating the image sensor chip after being bonded to the transparent substrate.

With reference to FIG. 4, a third embodiment of an image sensor package is shown and similar to the image sensor package as shown in FIG. 1. In the second embodiment, the image sensor chip 10 does not include the outer metal pads 17 formed on the rear surface 13 of the chip body 11 as shown in FIG. 1. Instead, the image sensor chip 10 may include a redistribution layer 19 formed on the rear surface 13 of the chip body 11. The redistribution layer 19 is connected to the conductive vias 14. Furthermore, a plurality of outer connectors 16 are formed on the redistribution layer 19. Therefore, the redistribution layer 19 is connected to the conductive vias 14 and the outer connector 16.

With the foregoing description, the metal dam of the image sensor package in accordance with the present invention is formed on the active surface of the chip body of the image sensor chip and is located on the non-sensitive area of the active surface. The metal dam is electrically insulated from the chip body of the image sensor chip. The glue dam is formed on the surface of the transparent substrate. The glue dam is aligned with the metal dam so that the transparent substrate is bonded to the image sensor chip through the glue dam and the metal dam. The second thickness of the glue dam is less than the first thickness of the metal dam. Accordingly, the metal dam and the glue dam are combined to form a dam structure. Compared to the dam structure and the conventional glue dam completely formed from the liquid glue, the quantity of the liquid glue to form the glue dam of the dam structure is obviously decreased. Furthermore, the dam structure facilitates the advancement of preventing the liquid glue from flowing toward the photosensitive layer in the manufacturing process of the image sensor package. Therefore, the yield of the image sensor package is effectively enhanced.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An image sensor package comprising:
    an image sensor chip having a chip body comprising an active surface, a rear surface opposite to the active surface, and a photosensitive layer formed on the active surface, wherein the active surface comprises:

a photosensitive area, wherein the photosensitive layer is located in the photosensitive area; and a non-sensitive area surrounding the photosensitive area;

a metal dam formed on the active surface of the chip body, located on the non-sensitive area of the active surface, surrounding the photosensitive area, electrically insulated from the chip body, and has a first thickness, wherein a gap is defined between an inside surface of the metal dam and an outside surface of the photosensitive area; and a transparent substrate having:

a surface facing toward the active surface of the chip body; and a glue dam formed on the surface and having a second thickness, wherein the glue dam is aligned with the metal dam, and the transparent substrate is bonded to the image sensor chip through the glue dam and the metal dam, wherein the second thickness is less than the first thickness.

2. The image sensor package as claimed in claim 1, wherein a percentage value of the second thickness to a total thickness of the first and second thickness is between 14.3% and 25%.

3. The image sensor package as claimed in claim 2, wherein the first thickness is 30 μm and the second thickness is between 5 μm and 10 μm.

4. The image sensor package as claimed in claim 1, wherein an outer side of the chip body of the image sensor package and an outer side of the metal dam are flush with an outer side of the transparent substrate and an outer side of the glue dam of the transparent substrate.

5. The image sensor package as claimed in claim 2, wherein an outer side of the chip body of the image sensor package and an outer side of the metal dam are flush with an outer side of the transparent substrate and an outer side of the glue dam of the transparent substrate.

6. The image sensor package as claimed in claim 1, wherein the image sensor chip further comprises:

a plurality of conductive vias formed through the chip body and located in the non-sensitive area;

a plurality of inner metal pads formed on the active surface of the chip body and respectively connected to the conductive vias; and a wiring layer formed on the active surface of the chip body and located on the non-sensitive area of the active surface, wherein the metal dam is formed on the wiring layer to be electrically insulated from the chip body, wherein the wiring layer comprises:

a plurality of metal wires formed on the active surface of the chip body and connected to the photosensitive layer and the inner metal pads; and an insulation layer formed on the active surface of the chip body and covering the metal wires, wherein the metal dam is formed on the insulation layer.

7. The image sensor package as claimed in claim 2, wherein the image sensor chip further comprises:

a plurality of conductive vias formed through the chip body and located in the non-sensitive area;

a plurality of inner metal pads formed on the active surface of the chip body and respectively connected to the conductive vias; and a wiring layer formed on the active surface of the chip body and located on the non-sensitive area of the active surface, wherein the metal dam is formed on the wiring layer to be electrically insulated from the chip body, wherein the wiring layer comprises:

a plurality of metal wires formed on the active surface of the chip body and connected to the photosensitive layer and the inner metal pads; and an insulation layer formed on the active surface of the chip body and covering the metal wires, wherein the metal dam is formed on the insulation layer.

8. The image sensor package as claimed in claim 6, wherein the image sensor chip further comprises:

a plurality of outer metal pads formed on the rear surface of the chip body and respectively connected to the conductive vias; and a plurality of outer connectors respectively formed on the outer metal pads.

9. The image sensor package as claimed in claim 7, wherein the image sensor chip further comprises:

a plurality of outer metal pads formed on the rear surface of the chip body and respectively connected to the conductive vias; and a plurality of outer connectors respectively formed on the outer metal pads.

10. The image sensor package as claimed in claim 6, wherein the image sensor package further comprises:

a redistribution layer formed on the rear surface of the chip body; and a plurality of outer connectors formed on the redistribution layer, wherein the redistribution layer is connected to the conductive vias and the outer connectors.

11. The image sensor package as claimed in claim 7, wherein the image sensor package further comprises:

a redistribution layer formed on the rear surface of the chip body; and a plurality of outer connectors formed on the redistribution layer, wherein the redistribution layer is connected to the conductive vias and the outer connectors.

12. The image sensor package as claimed in claim 6, wherein the insulation layer of the wiring layer comprises:

a passivation layer formed on the active surface of the chip body and covering the metal wires; and a dielectric layer formed on the passivation layer, wherein the metal dam is formed on the dielectric layer.

13. The image sensor package as claimed in claim 7, wherein the insulation layer of the wiring layer comprises:

a passivation layer formed on the active surface of the chip body and covering the metal wires; and a dielectric layer formed on the passivation layer, wherein the metal dam is formed on the dielectric layer.

14. The image sensor package as claimed in claim 1, wherein the metal dam has a light-absorbing layer formed on an exposed surface thereof.

15. The image sensor package as claimed in claim 2, wherein the metal dam has an exposed surface and a light-absorbing layer formed on the exposed surface.

16. The image sensor package as claimed in claim 6, wherein the metal dam has an exposed surface and a light-absorbing layer formed on the exposed surface.

17. The image sensor package as claimed in claim 7, wherein the metal dam is made by an electroless-plated metal.

18. The image sensor package as claimed in claim 16, wherein a melting point of the metal dam is greater than or is equal to 300° C.

19. The image sensor package as claimed in claim 17, where a melting point of the metal dam is greater than or is equal to 300° C.

* * * * *